(12) United States Patent
Okabe

(10) Patent No.: US 6,459,285 B1
(45) Date of Patent: Oct. 1, 2002

(54) BURN-IN APPARATUS FOR SCREENING PLURALITY OF SEMICONDUCTOR DEVICES

(75) Inventor: Fumihiro Okabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/525,766

(22) Filed: Mar. 14, 2000

(30) Foreign Application Priority Data

Mar. 15, 1999 (JP) .......................................... 11-068250

(51) Int. Cl.$^7$ .............................................. G01R 31/02
(52) U.S. Cl. ........................ 324/754; 324/760; 324/765
(58) Field of Search ................................ 324/760, 765, 324/158.1, 73.1; 165/80.5, 80.4; 257/48; 438/14, 18

(56) References Cited

U.S. PATENT DOCUMENTS

| 4,968,931 A | * | 11/1990 | Littlebury et al. | ........... 324/760 |
| 5,504,369 A | * | 4/1996 | Dasse et al. | ............... 257/620 |
| 5,898,186 A | * | 4/1999 | Farnworth et al. | ............ 257/48 |

FOREIGN PATENT DOCUMENTS

| JP | 63-124443 | 5/1988 |
| JP | 5-121502 | 5/1993 |
| JP | 6-5677 | 1/1994 |
| JP | 10-284556 | 10/1998 |

* cited by examiner

*Primary Examiner*—Vinh P. Nguyen
(74) *Attorney, Agent, or Firm*—Sughrue Mion, PLLC

(57) ABSTRACT

A semiconductor wafer has a device zone and a peripheral edge zone. Semiconductor devices to be screened are formed in a matrix form on the device zone of the semiconductor wafer. A plurality of wires connected to the semiconductor devices are formed on the device and peripheral edge zones. In the device zone, the wires are formed among lines of the semiconductor devices. A burn-in apparatus includes a holder, a thermal controller, a signal generator, and interconnection members. The holder holds a plurality of the semiconductor wafers in order to install them in a room. The thermal controller controls temperature in the room to heat the semiconductor wafers up to a predetermined temperature. The signal generator generates a test pattern signal for screening the semiconductor devices. Each of the interconnection members has a plurality of electrodes formed so as to contact the ends of the wires, and presses the electrodes into the wires to establish complete connection between the electrodes and the wires.

4 Claims, 9 Drawing Sheets

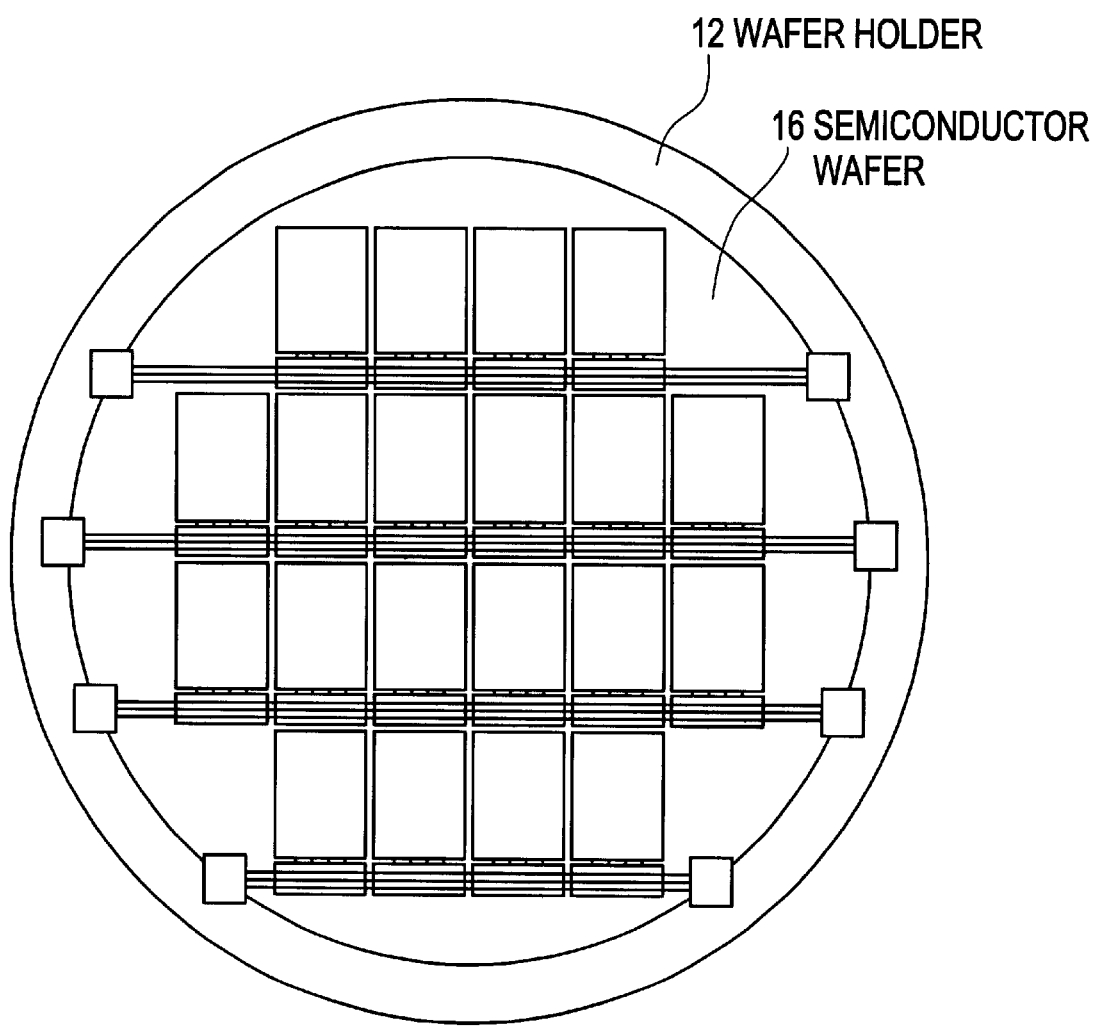

BURN-IN APPARATUS FOR SCREENING PLURALITY OF SEMICONDUCTOR DEVICES

BACKGROUND OF THE INVENTION

1. Field of the Invention

The present invention relates to a semiconductor wafer on which semiconductor devices to be screened are formed. The present invention relates to a burn-in apparatus for screening semiconductor devices formed on a semiconductor wafer. The present invention relates, more particularly to a burn-in apparatus and a semiconductor wafer which enables screening many semiconductor devices at once without connection failures on wires.

2. Description of the Related Art

Burn-in screening has been known as a technique for eliminating semiconductor devices having potential failures. The screening is usually performed under elevated temperatures, and the devices being screened have been electrically stressed for a predetermined time period. Thus screened device tends to induce accelerated failures which may appear early in the device's lifetime.

Conventional screening has been applied to devices which are cut from the wafer and mounted into packages. Usually, the devices are placed in the packages and then the packages go into sockets on the burn-in boards. And then, the boards are placed in the burn-in apparatus for screening.

Recently, demands for screening unpackaged devices have been developing because the unpackaged devices have been widely used. However, it is difficult to individually screen devices which have been cut away from the wafer. Therefore, demands for wafer level burn-in have been developing.

Such the wafer level burn-in techniques are disclosed in Unexamined Japanese Patent Application KOKAI Publications Nos. S63-124443, H5-121502, H6-5677, and H10-284556. The disclosures of the above applications are incorporated herein by reference in their entirety.

In each of the techniques disclosed in the above applications, common conductive X-axis and Y-axis pathways for screening are formed among a plurality of devices formed on a wafer, and common terminals connected to the common pathways are formed at wafer edges. More precisely, common pathways 111 are formed among semiconductor devices, and common terminals 112 are formed at wafer edge, as shown in FIG. 6A. During the screening process, the wafer is stuck to a stage 113 in the burn-in apparatus as shown in FIG. 6B. And then, a probe 114 contacts the common terminals 112, as described in Unexamined Japanese Patent Application KOKAI Publication No. H5-121502. Then, voltages, test pattern signals, and the like necessary for screening are supplied to the semiconductor devices from a power source 115 and a pulse generator 116 via the probe 114, the common terminals 112 and the common pathways 111. Thus, the semiconductor devices on the wafer are screened.

FIG. 7 is a diagram for explaining the screening process disclosed in Unexamined Japanese Patent Application KOKAI Publication No. H10-284556. A semiconductor wafer 122 on which semiconductor devices are formed is mounted on a stage 121 in a burn-in apparatus, as a first step. Then, a contact sheet 123 is placed on the wafer 122, and a base unit 124 is placed on the contact sheet 123. One major surface of the contact sheet 123 facing the wafer 122 has terminals which has a pattern same as that of terminals on the semiconductor devices. The other side of the contact sheet 123 has terminals which has a pattern same as that of terminals formed on a surface of the base unit 124 which facing the contact sheet 123. During the screening process, a mechanical jig 125 is pressed upon the burn-in apparatus, thus, the contact sheet 123 and the base unit 124 are pressed upon the wafer 122. This contact establishes electrical connection between the terminals on the base unit 124 and the terminals on the semiconductor devices while sandwiching the contact sheet 123 therebetween. A signal generator 126 generates a test pattern signal, and supply it to the semiconductor devices via the base unit 124 being connected to the signal generator 126 and via the contact sheet 123. Thus, the semiconductor devices are screened.

According to the techniques disclosed in the above mentioned Unexamined Japanese Patent Application KOKAI Publications Nos. S63-124443, H5-121502, and H6-5677, the x-axis and y-axis common pathways 111 are formed among the semiconductor devices. Because such wiring formation is very complex, the formation process is also complex. Moreover, the above-described techniques require many steps before carrying out the screening such as formation of the common terminal 112 and the like. Therefore, it takes a long time before carrying out the screening. Such the extra steps also raise the manufacturing cost.

According to the technique disclosed in Unexamined Japanese Patent Application KOKAI Publication No. H5-121502, voltages and signals necessary for the screening are supplied to the semiconductor devices via the probe 114 which contacts the common terminals 112 on the wafer. Elevated temperature in the burn-in apparatus may expand the probe 114 itself, and then the probe 114 may fail to precisely contact the common terminals 112. That is, the technique disclosed in the above application has a problem which causes unsuccessful screening. Moreover, the stage 113 can hold only one wafer. Therefore, screening efficiency is poor, especially in a case where the wafer must be placed in a chamber under a constant temperature for a long time.

In the case of Unexamined Japanese Patent Application KOKAI Publication No. H10-284556, the base unit 124 and the contract sheet 123 are pressed upon the semiconductor wafer 122 by the mechanical jig 125. This structure permits the burn-in apparatus to place only one wafer therein for each screening. This technique also has poor efficiency.

SUMMARY OF THE INVENTION

The present invention has been made in consideration of the above. It is an object of the present invention to provide a burn-in apparatus and a semiconductor wafer for screening semiconductor devices efficiently. It is another object of the present invention to provide a burn-in apparatus and a semiconductor wafer for screening semiconductor devices successfully. A further object of the present invention is to provide a burn-in apparatus and a semiconductor wafer for screening multiple semiconductor devices simultaneously without connection failures on wires prepared for the screening.

To achieve the above objects, a burn-in apparatus according to a first aspect of the present invention is a burn-in apparatus comprising:

a holder which holds a plurality of semiconductor wafers each having an inner zone prepared for arranging thereon a plurality of semiconductor devices to be screened, and a peripheral edge zone around the inner zone, in order to install the plurality of the semiconductor wafers in a room;

a thermal controller which controls temperature of the room so as to heat the plurality of the semiconductor wafers up to a predetermined temperature;

a signal generator which generates a test pattern signal for screening the semiconductor devices on the plurality of the semiconductor wafers which have been heated up to the predetermined temperature; and interconnection members which electrically interconnect the signal generator and each of the semiconductor devices, in order to provide the semiconductor devices respectively with the signals generated by the signal generator.

This invention realizes screening the semiconductor devices formed on the plurality of semiconductor wafers installed in the room. In other words, it realize efficient screening wherein many semiconductor devices are screened.

The holder may hold the semiconductor wafers each having a plurality of pathways which are formed across the inner and peripheral edge zones for supplying the test pattern signals to the semiconductor devices; and each of the interconnection members may have a plurality of electrodes being connected to the signal generator, and presses the electrodes so as to contact the pathways.

Each of the interconnection members may comprise;

a first board on which the semiconductor wafer is vacuum fixed; and a second board which collaborates with the first plate to provide the electrodes with pressure for making contact with the pathways.

The plurality of the electrodes may be arranged so as to contact both ends of the pathways which are formed among lines of the matrix formed semiconductor devices on the semiconductor wafer.

The plurality of the electrodes may be grouped by ends of the pathways being connected to, and the electrodes in the same group may be connected to each other by wires while one of the electrodes in the group is connected to the signal generator.

A semiconductor wafer according to a second aspect of the present invention is a semiconductor wafer comprising:

a device zone which is prepared for forming thereon semiconductor devices, and a peripheral zone which is prepared around the device zone;

a plurality of semiconductor devices which are formed on the device zone to be subjected to screening; and a plurality of wires which are formed across the device and peripheral zones in order to supply signals for screening respectively to the plurality of the semiconductor devices, wherein the wires are straight while being parallel to each other in the device zone.

The wires may extend straightly from the device zone to the peripheral zone.

The wires may be formed so that intervals among the ends of the wires on the peripheral zone are wider than intervals among the wires on the device zone.

BRIEF DESCRIPTION OF THE DRAWINGS

These objects and other objects and advantages of the present invention will become more apparent upon reading of the following detailed description and the accompanying drawings in which:

FIG. 2 is a diagram showing a state where the semiconductor wafer according to the first embodiment is held by a wafer holder;

DETAILED DESCRIPTION OF THE PREFERRED EMBODIMENTS

First Embodiment

A semiconductor wafer according to a first embodiment of the present invention will now be described with reference to accompanying drawings.

Figure 1:
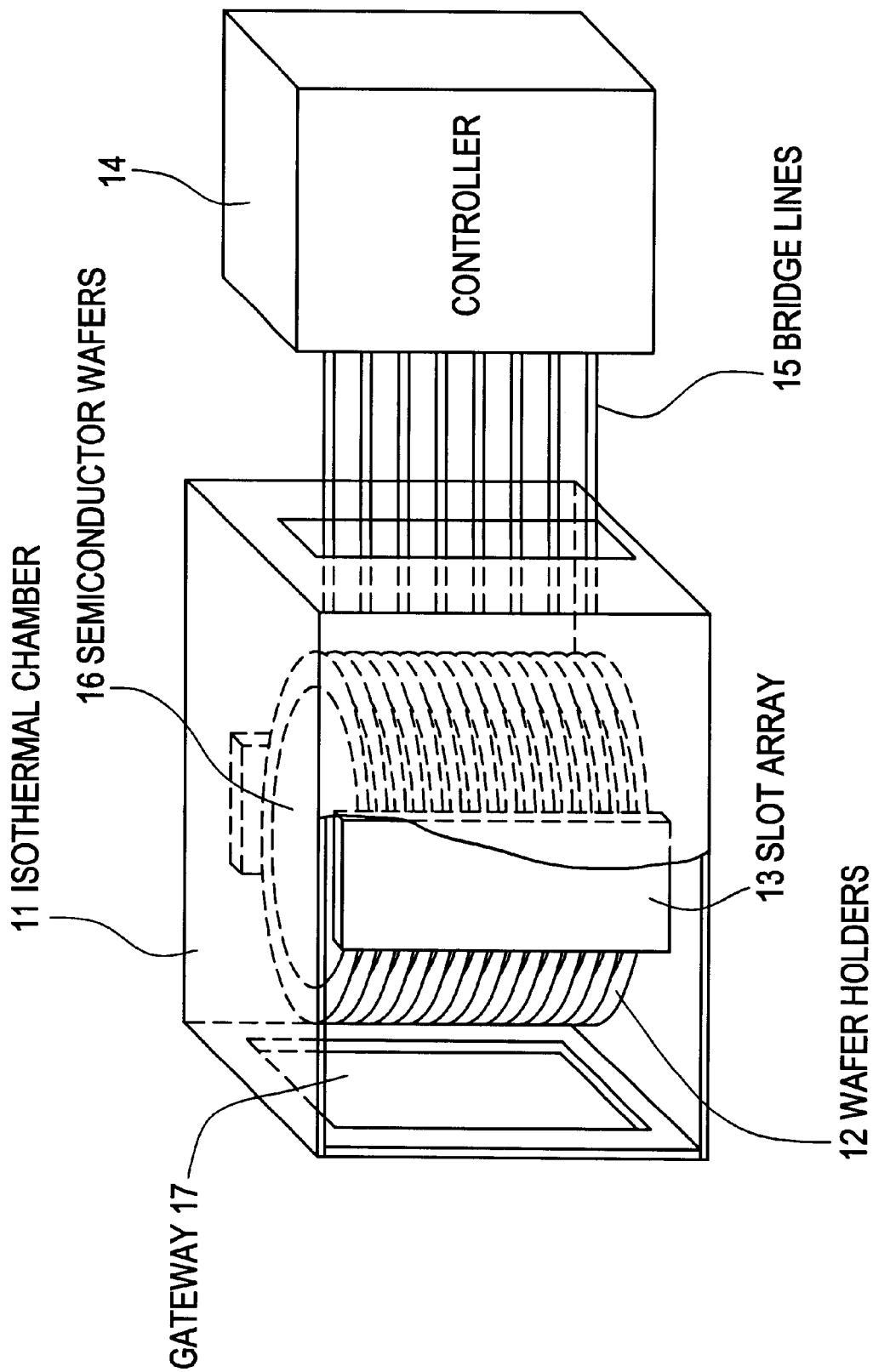
FIG. 1 is a diagram showing a state where semiconductor devices on a semiconductor wafer according to a first embodiment are being screened.

FIG. 1 shows a state where semiconductor devices on the semiconductor wafer according to the first embodiment are being screened in a burn-in apparatus.

As shown in FIG. 1, the burn-in apparatus comprises an isothermal chamber 11, wafer holders 12, a slot array 13, a controller 14, and bridge lines 15.

The isothermal chamber 11 has a gateway 17 through which semiconductor wafers 16, on which semiconductor devices to be screened are formed, are installed in the isothermal chamber 11, and is equipped with a heater (not shown) or the like which heats the installed semiconductor wafers 16 up to a predetermined temperature and maintains it.

The wafer holders 12 hold the semiconductor wafers 16, and electrically interconnect the semiconductor devices on the wafers 16 and the bridge lines 15. The structure of the wafer holders 12 will be described later.

The slot array 13 is prepared in the chamber 11 to hold a plurality of wafer holders 12 holding the wafers 16.

The controller 14 generates a source voltage, a control signal, and the like necessary for screening, and supplies them to the semiconductor devices on the wafers 16 via the bridge lines 15. The controller 14 also controls the temperature in the isothermal chamber 11, and the burn-in apparatus in accordance with a given program or the like.

The bridge lines 15 electrically interconnect the controller 14 and wafer holders 12. Thus, the source voltage, control signal or the like for the screening are supplied to the wafers 16 in the isothermal chamber 11 from the controller 14.

The structures of the wafer holder 12 and the semiconductor wafer 16 will now be described.

FIG. 2 shows a state where the semiconductor wafer 16 is held by the wafer holder 12.

Figure 3A:
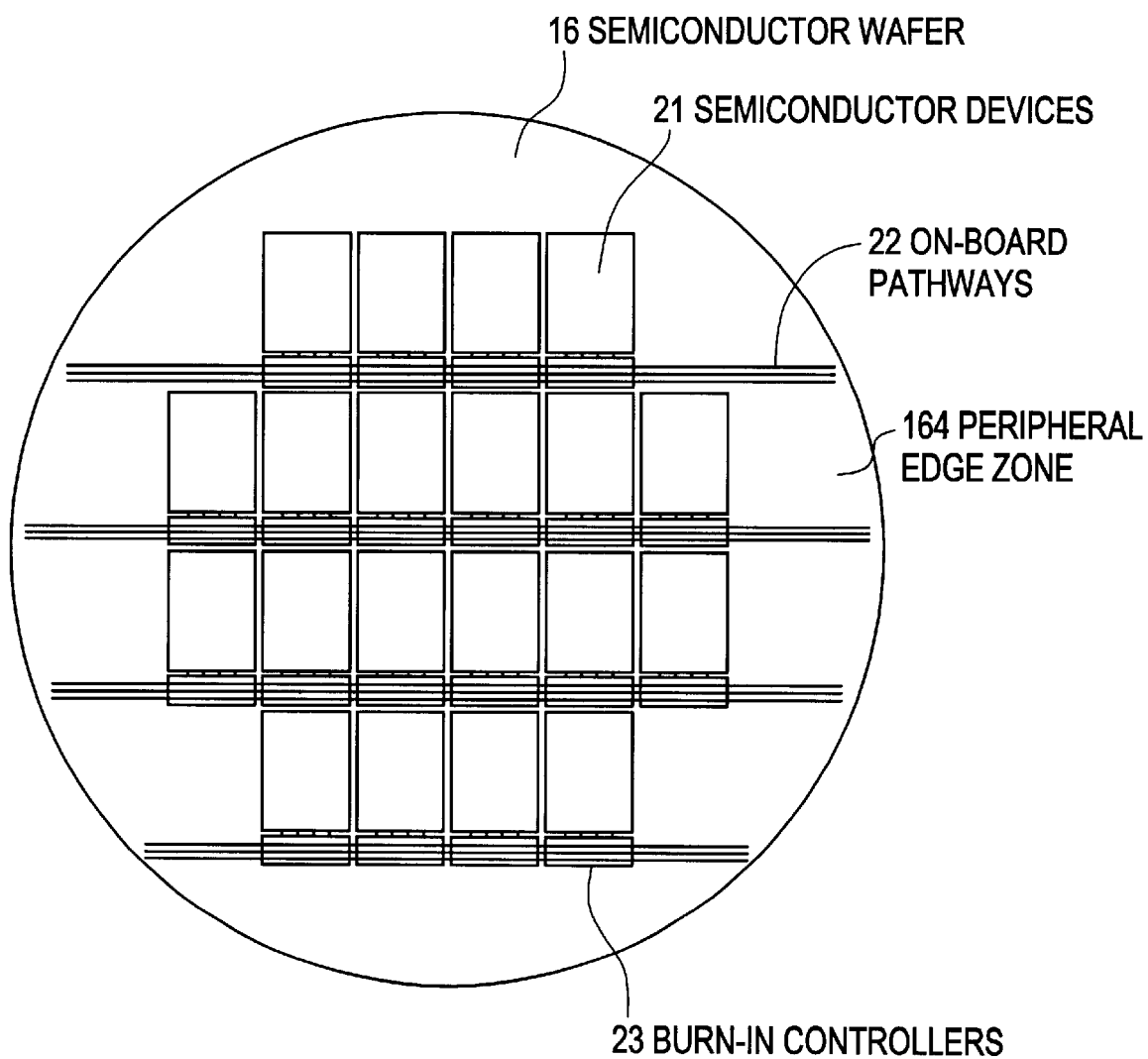
FIG. 3A is a diagram showing the structure of the semiconductor wafer according to the first embodiment.

As shown in FIG. 3A, semiconductor devices 21, on-board pathways 22, and burn-in controllers 23 are formed on the wafer 16 with peripheral edge zone 16a.

A plurality of the semiconductor devices 21 are formed on an inner zone of the wafer 16 ( hereinafter, referred to as a device zone) in matrix form. The formed semiconductor devices 21 will be screened by the burn-in apparatus.

Each of the on-board pathways 22 has several (for example, four) wires as a unit. (Note that only three wires of four are shown in FIG. 3A.) The on-board pathways 22 are arranged among lines of the semiconductor devices 21 unit by unit, and the arranged pathways 22 are straight. That is, the pathways 22 are formed in simple wiring patterns. This means that the on-board pathways 22 can be formed by a simple method such as a reduction projection step and repeat exposure. For the sake of connection to the bridge lines 15 via the wafer holder 12 (the structure thereof will be described later), the on-board pathways 22 straightly extend to edge of the wafer 16, that is, extend to joint portions which will be connected to the wafer holder 12. To avoid wire break and short circuit of the on-board pathways 22, appropriate gauge and intervals are given to the wires. For the same purpose, the wires are shielded on the device zone while the wire ends at the wafer edge are exposed for contact.

The burn-in controllers 23 are formed on the wafer 16 so as to be adjacent to the semiconductor devices 21 respectively. Each of the burn-in controllers 23 supplies a source voltage, a control signal, and the like from the controller 14, to its corresponding semiconductor device 21.

Figure 3B:
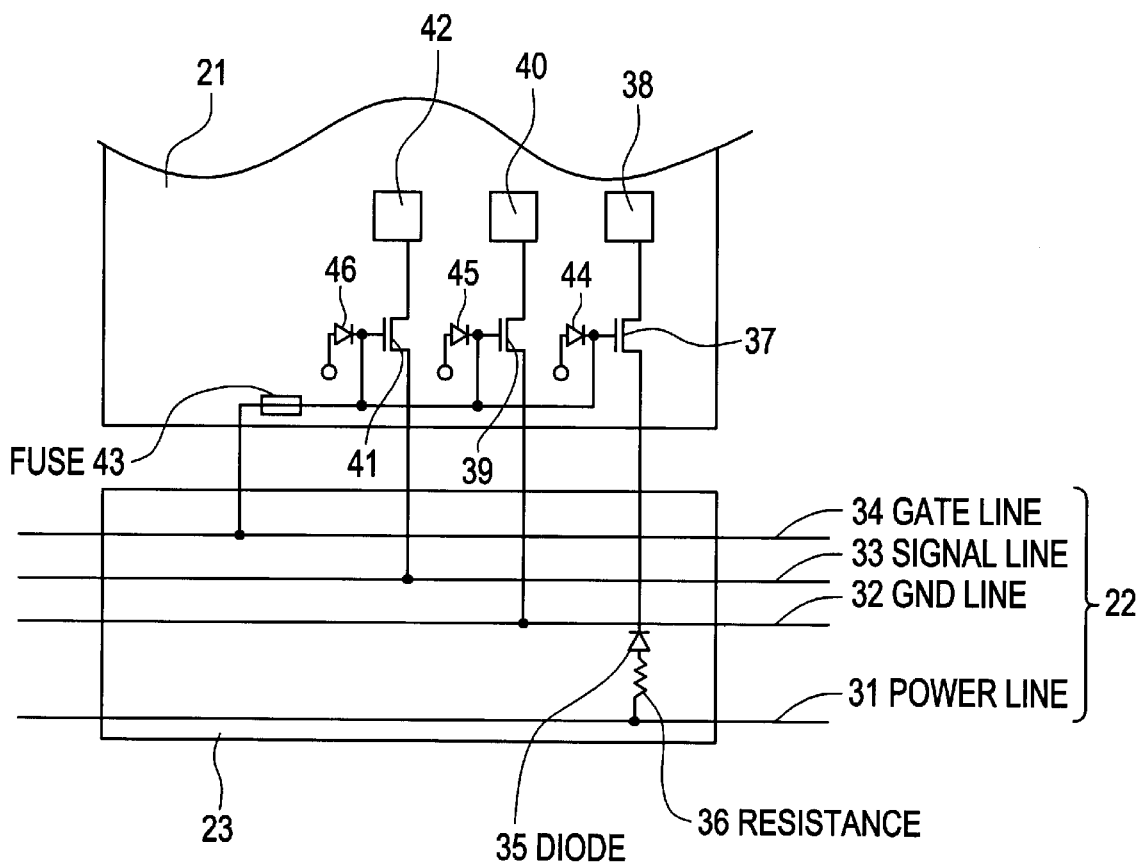
FIG. 3B is a diagram showing connection between the semiconductor devices on the semiconductor wafer shown in FIG. 3A and a burn-in controller.

FIG. 3B shows the structure of connection between the semiconductor device 21 and the burn-in controller 23.

As shown in FIG. 3B, a unit of the on-board pathways 22 runs through lined burn-in controllers 23. Each wire unit contains lines such as a power line 31, a ground (GND) line 32, a signal line 33, and a gate line 34. Each semiconductor device 21 has pads 38, 40 and 42, and switching transistors (hereinafter referred to as switching Tr) 37, 39 and 41.

The switching Tr 37, 39 and 41 interconnect the pads 38, 40 and 42 with the power line 31, the GND line 32, and the signal line 33 respectively. The pads 38, 40, and 42 work as terminals of a circuit (not shown) of the semiconductor device 21. Those terminals will be used in practical use.

As shown in FIG. 3B, the power line 31 is connected to one source/drain of the switching Tr 37 via a diode 35 and a resistance 36, while the other source/drain is connected to the pad 38. This pair of the diode 35 and resistance 36 functions as an anti-overcurrent device. That is, if the semiconductor device 21 is broken during the screening, the corresponding anti-overcurrent device prevents an overcurrent from being applied to other semiconductor devices 21.

The GND line 32 is connected to one source/drain of the switching Tr 39. The other source/drain of the switching Tr 39 is connected to the pad 40.

The signal line 33 is connected to one source/drain of the switching Tr 41. The other source/drain of the switching Tr 41 is connected to the pad 42.

Gates of the switching Tr 37, 39 and 41 are connected to the gate line 34 via a fuse 43, while being connected to the substrate of the semiconductor device 21 via diodes 44, 45 and 46 respectively. Purpose of the diodes 44, 45 and 46 is to maintain a gate potential in a predetermined range during the practical use. The potential of the substrate is restricted, for example, so as to be lower than threshold voltages of the switching Tr 37, 39 and 41.

The structure of the wafer holder 12 will now be described.

Figure 4A:
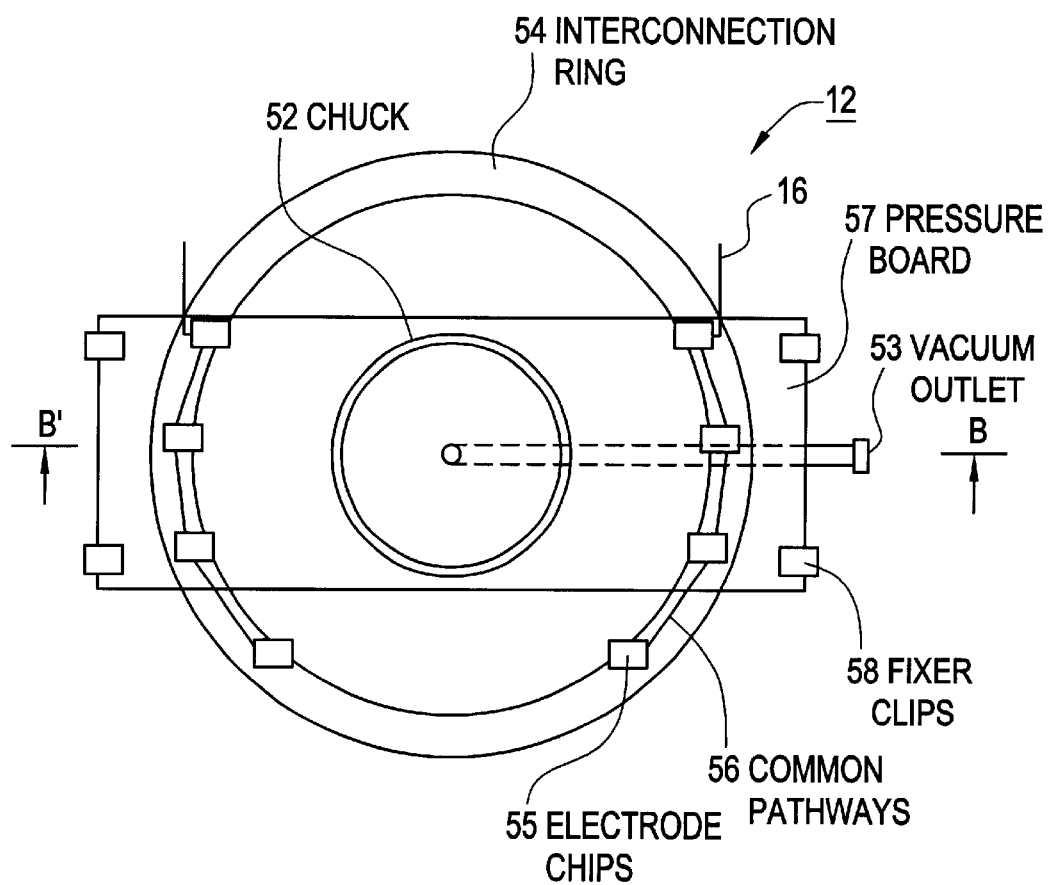
FIG. 4A is a plan view showing the structure of the wafer holder.
Figure 4B:
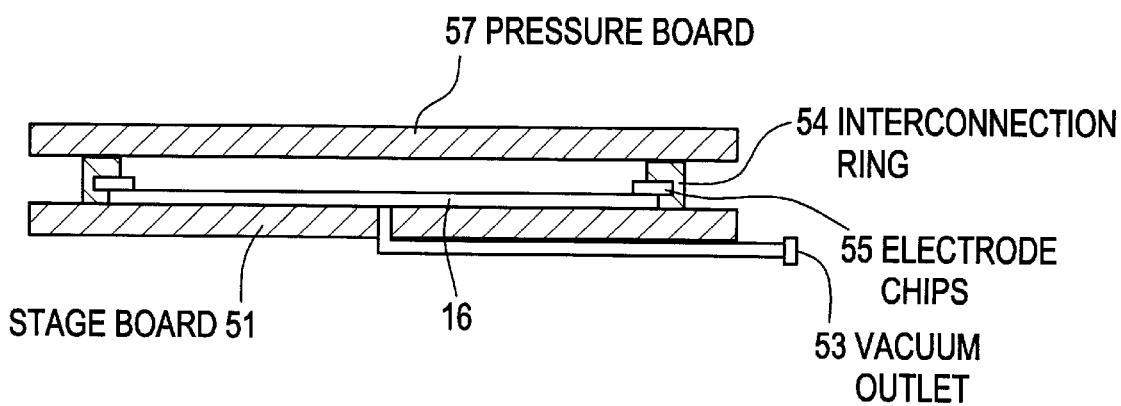
FIG. 4B is a cross sectional view along a B–B' line in FIG. 4A.
Figure 4C:
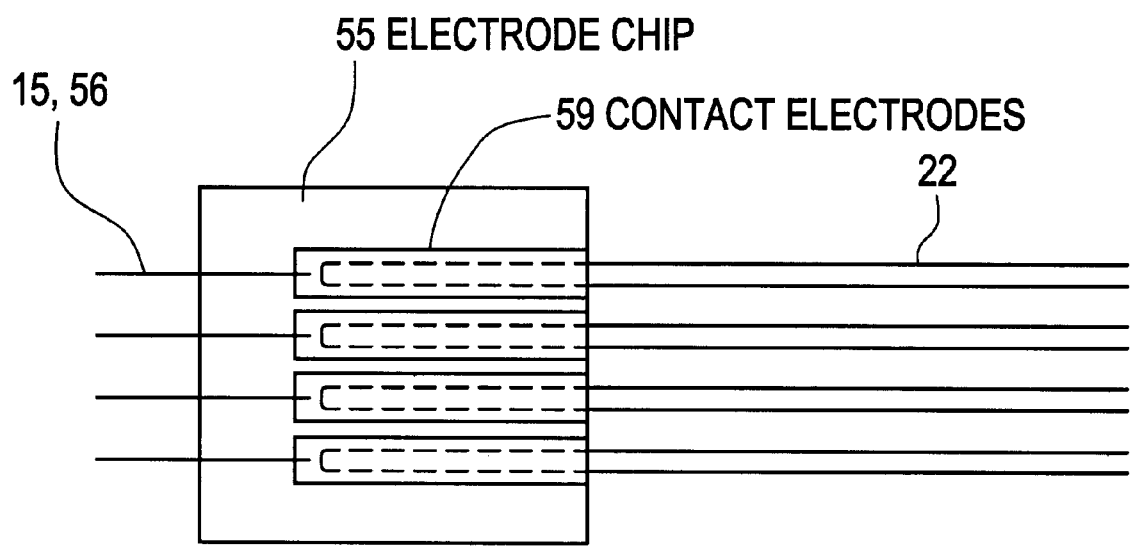
FIG. 4C is a diagram showing connection between an electrode chip of the wafer holder and on-board pathways on the semiconductor wafer.

FIGS. 4A, 4B and 4C are diagrams showing the structure of the wafer holder 12. FIG. 4A is a plan view showing the wafer holder 12, and FIG. 4B is a cross sectional view along a line B–B' in FIG. 4A. FIG. 4C shows the structure of connection between the wafer holder 12 and the on-board pathways 22 on the wafer 16.

As shown in FIGS. 4A and 4B, the wafer holder 12 comprises a stage board 51, a chuck 52, a vacuum outlet 53, an interconnection ring 54, electrode chips 55, common pathways 56, a pressure board 57, and fixer clasps 58.

The stage board 51 comprises the chuck 52 and the vacuum outlet 53 which are prepared for fixing the wafer 16 on the stage board 51. That is, a vacuum pump (not shown) or the like vacuums out the air in the chuck 52 through the vacuum outlet 53, thus the wafer 16 is stuck to the stage board 51.

The interconnection ring 54 comprises the electrode chips 55 and the common pathways 56. The interconnection ring 54 is placed on the stage board 51 after the wafer 16 is stuck on the stage board 51. The electrode chips 55 are arranged at inner side of the interconnection ring 54 so as to contact ends of the on-board pathways 22 on the wafer 16. That is, positions of the electrode chips 55 when the wafer 16 is mounted on the wafer holder 12 substantially coincide with positions of ends of the on-board pathways 22. As shown in FIG. 4A, the electrode chips 55 are classified into two groups by the ends of the on-board pathways 22 being connected to, and the electrode chips 55 in the same group are connected to each other by the common pathways 56. Further, one of the electrode chips 55 in the group is connected to the bridge line 15.

The electrode chips 55 are pressed upon the on-board pathways 22 as the interconnection ring 54 is pressed upon the stage board 51. More precisely, each of the electrode chips 55 has contact electrodes 59, as shown in FIG. 4C, which contact the wires in the unit of the on-board pathways 22. That is, the contact electrodes 59 are arranged at intervals which coincide with intervals of the wires. Each of the contact electrodes 59 is connected to the bridge line 15 or the common pathways 56. Accordingly, electric connection between the on-board pathways 22 and the bridge lines 15 will be established when the interconnection ring 54 is pressed upon the stage board 51. This structure realizes successful screening, because the connection between the on-board pathways 22 and the electrode chips 55 is established at the ends of the on-board pathways 22, thus, it is easy to see connection status. The number of wires in a unit of the common pathways 56 and a unit of the bridge lines 15 is the same as that of the wires in the unit of the on-board pathways 22.

The pressure board 57 is placed on the interconnection ring 54. The fixer clasps 58 tighten the pressure board 57 so that the pressure board 57 and the stage board 51 press the interconnection ring 54, thus the contact electrodes 59 contact the on-board pathways 22 completely.

Since the semiconductor wafers 16 are mounted on the wafer holders 12 as described above, common terminals (pads) which have been employed in the conventional techniques are unnecessary. Moreover, complete connection between the bridge lines 15 and the on-board pathways 22 is established. Those features prevent connection failures caused by thermal expansion during the screening process from appearing, thus, successful screening is realized. Further, the above structures of the wafers 16 with the wafer holders 12 allow the isothermal chamber 11 to contain stacked multiple wafers 16 as shown in FIG. 1. This feature realizes screening the mass of semiconductor devices 21 simultaneously in a small space.

Steps of screening the semiconductor devices 21 on the semiconductor wafers 16 by the above described burn-in apparatus will now be described.

First, pre-test for finding short circuits and the like of the semiconductor devices 21 is carried out, by which semiconductor devices 21 having failures unsuitable for screening are eliminated. More precisely, the fuses 43 of such the unsuitable devices 21 are cut by laser beam or the like, thus they will not be screened.

And then, the semiconductor wafers 16 are mounted on the wafer holders 12. In this step: the wafers 16 are placed on the stage boards 51 of the wafer holders 12; and sets of the stage board 51 and the pressure boards 57 are tightened by the fixer clasps 58. Thus, the electrode chips 55 contact the on-board pathways 22, and this contact electrically interconnects the bridge lines 15 and the semiconductor devices 21 on the wafer 16.

The plurality of the wafer holders 12 on each of which the wafer 16 is fixed are attached to the slot array 13. The bunch of wafers 16 and wafer holders 12 are loaded into the isothermal chamber 11 through the gateway 17.

After the loading, the controller 14 starts to elevate the temperature in the isothermal chamber 11 in accordance with a given program and the like, in response to an instruction given by an operator of the apparatus or the like.

When the temperature in the isothermal chamber 11 reaches a predetermined level, the controller 14 activates the switching Tr 37, 39 and 41 by providing the gate lines 34 with control signals having a predetermined level. The controller 14 also provides the semiconductor devices 21 with source voltages via the power lines 31 in order to drive the semiconductor devices 21. And then, the controller 14 provides the semiconductor devices 21 with test pattern signals via the signal lines 33, thus, the semiconductor devices 21 are screened.

After the screening, the bunch of the wafer holders 12 is unloaded from the isothermal chamber 11 through the gateway 17. In the same manner, following bunches of the semiconductor devices 21 are subjected to the screening one after another. Finally, the semiconductor devices 21 which passed the screening are diced to be products.

As described above, the present invention prevents contact failures caused by thermal expansion, because the electrode chips 55 of the wafer holder 12 completely contact the on-board pathways 22 of the semiconductor wafer 16. This feature realizes successful screening for the semiconductor devices 21. Since the realized screening is so secure, only the semiconductor devices 21 actually having rich reliability will pass the screening. Moreover, the present invention reduces the steps of the screening, because preparation of common terminals (pads) on the wafers 16 is unnecessary. Such the elimination is realized by the complete connection between the electrode chips 55 and the on-board pathways 22 featured in the present invention.

Furthermore, multiple stacked semiconductor wafers 16 can be screened simultaneously, because the on-board pathways 22 are electrically connected to the bridge lines 15 via the electrode chips 55. That is, the present invention has an advantage over the conventional techniques because it realizes screening simultaneously the mass of semiconductor devices 21 in a small space.

Second Embodiment

A semiconductor wafer according to a second embodiment of the present invention will now be described with reference to accompanying drawings.

Figure 5:
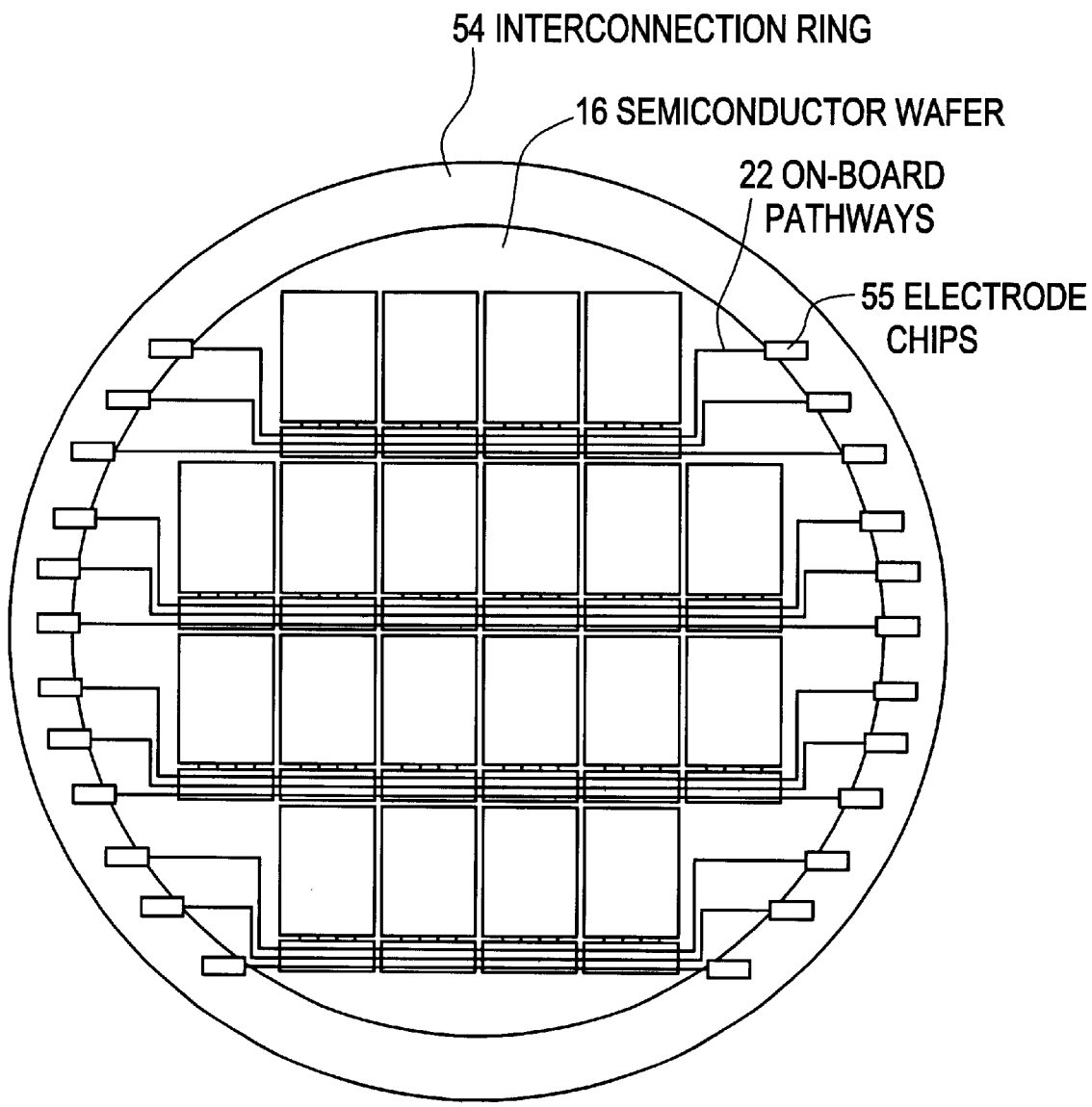
FIG. 5 is a diagram showing the structure of a semiconductor wafer according to a second embodiment.
Figure 6A:
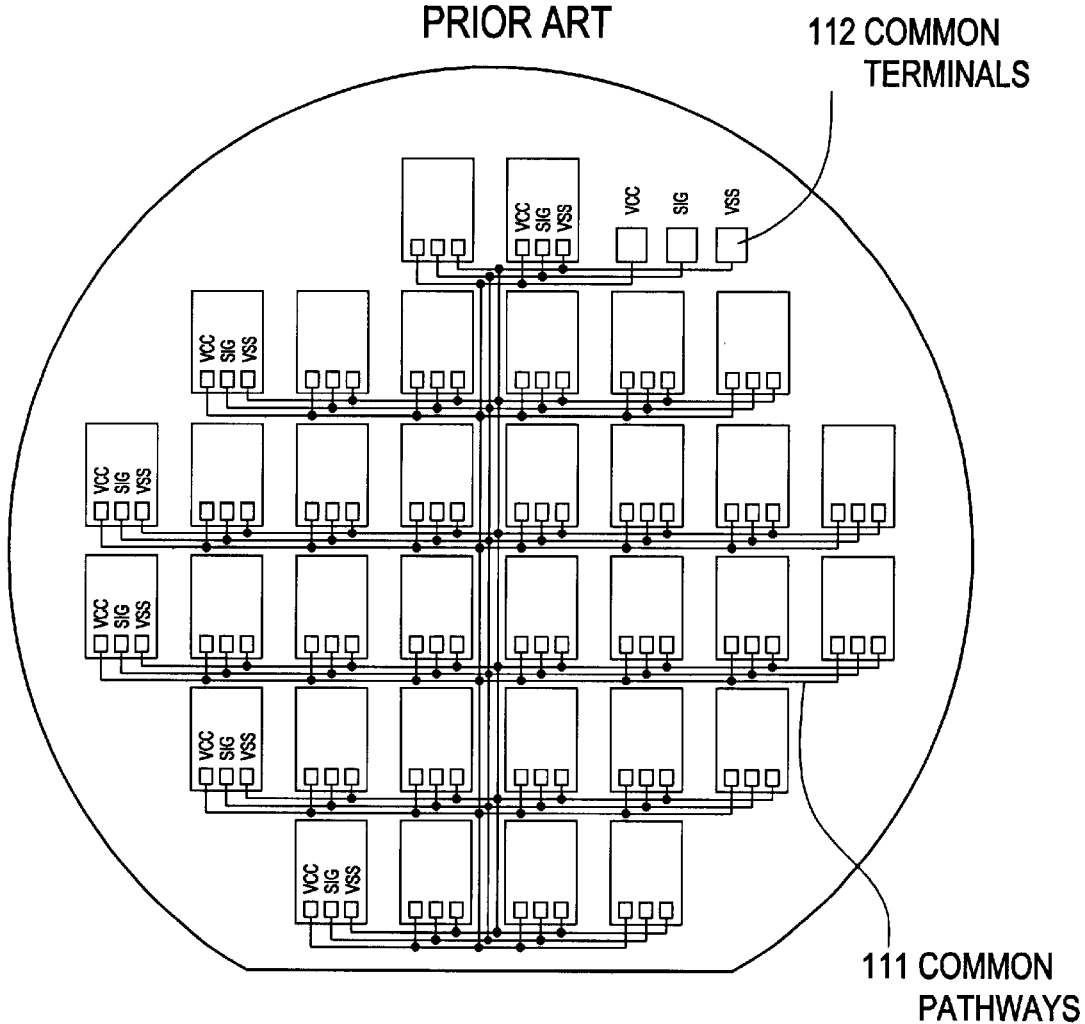
FIG. 6A is a diagram showing the structure of a conventional semiconductor wafer.
Figure 6B:
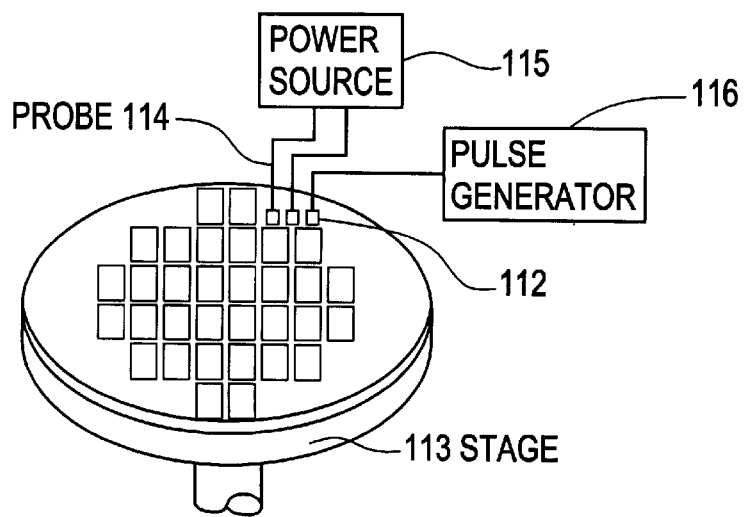
FIG. 6B is a diagram showing a state where semiconductor devices on the semiconductor wafer shown in FIG. 6A are being screened.
Figure 7:
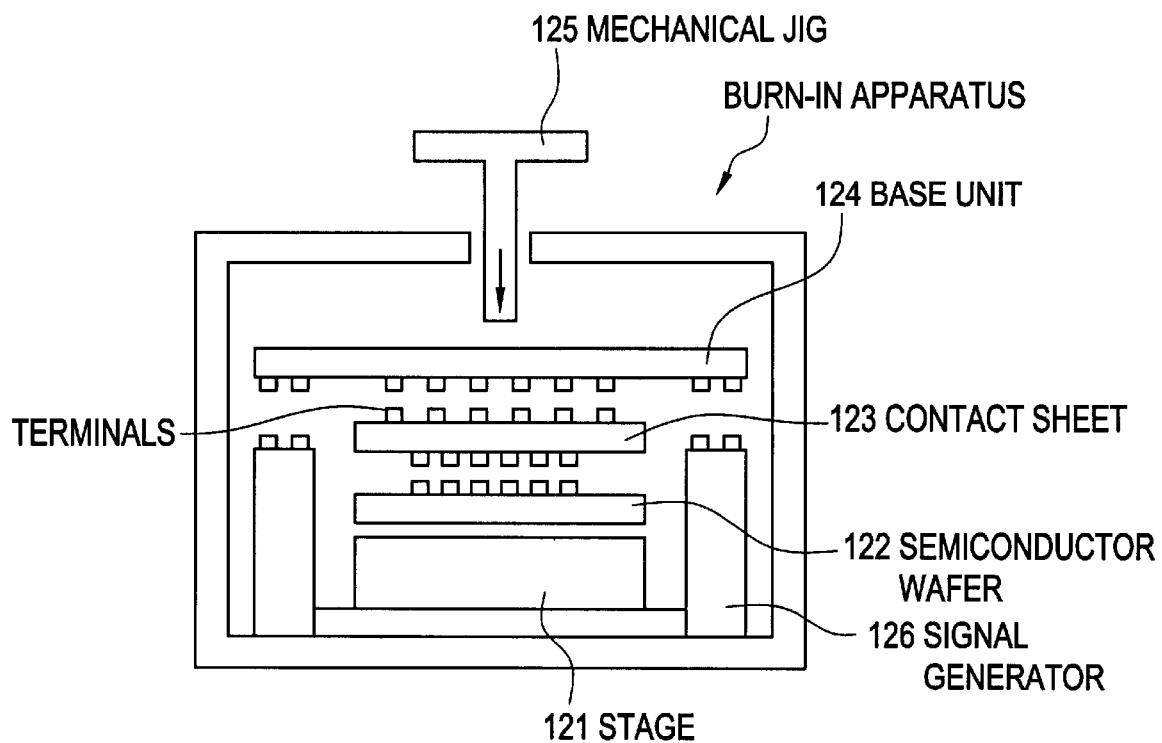
FIG. 7 is a diagram showing the structure of a conventional burn-in apparatus.

A semiconductor wafer according to the second embodiment is similar to the semiconductor wafer 16 described in the first embodiment. This embodiment features the structure of wafer edge which differs from the wafer 16 of the first embodiment. More precisely, intervals among the ends of the on-board pathways 22 at the edge of the wafer 16 of this embodiment are wider than intervals among them in the device zone of the wafer 16 (inner zone where the semiconductor devices are formed) as shown in FIG. 5. In other words, the ends of the wires of the on-board pathways 22 are scattered at the wafer edge.

The arrangement of the electrode chips 55 of the wafer holder 12 will be modified as the structure of the wafer 16 is modified. That is, the electrode chips 55 are arranged on the interconnection ring 54 so as to contact the wires of the on-board pathways 22 respectively. In this case, the electrode chips 55 are grouped by ends of the on-board pathways 22 being connected to, and the electrode chips 55 in the same group are connected to each other by the common pathway 56. For example, the electrode chips 55 being connected to one ends of the power lines 31 are connected to each other via one common pathway 56; and the electrode chips 55 being connected to one ends the signal lines 33 are connected to each other via another common pathway 56. In the same manner, the electrode chips 55 being connected to the other ends of the on-board pathways 22 are connected to each other via their corresponding common pathway 56.

Other structures of the wafer 16, and the structure of the burn-in apparatus are substantially the same as those described in the first embodiment. The steps of screening the semiconductor devices 21 described in the first embodiment are also employed in this embodiment.

Aforementioned wide intervals among the ends of the on-board pathways 22 at the wafer edge are helpful to form the electrode chips 55 so that the electrode chips 55 themselves coincide with the positions of the ends of the on-board pathways 22. In other words, each of the electrode chips 55 does not require its own minute contact elements (contact electrodes 59 in the first embodiment) to be respectively connected to the wires of the on-board pathways 22. As a result, precise mounting of the wafer 16 on the wafer holder 12 can be done without any difficulties in processing and adjusting.

The wafer holders 12 described in the above embodiments may employ other structures which enable the electrode chips 55 to contact the on-board pathways 22. For example, the wafer holder 12 may have fixer clamps instead of the pressure board 57, which bind the stage board 51 and the interconnection ring 54. Or, the wafer holder 12 may have clothespin-like clips which pinches the wafer 16 to hold it. In this case, one side of contact surface of the clip has the electrode chips 55. The clip has dual function of holding and connecting. That is, the clip can connect the electrode chips 55 to the on-board pathways 22 completely while holding the wafer 16.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-068250 filed on Mar. 15, 1999 and including specification, claims, drawings and summary. The disclosure of the above Japanese Patent Application is incorporated herein by reference in its entirety.

What is claimed is:

1. A burn-in apparatus comprising:
   a slot array which holds a plurality of semiconductor wafers each having an inner zone prepared for arranging thereon a plurality of semiconductor devices to be screened, and a peripheral edge zone around said inner zone, in order to install the plurality of semiconductor wafers in a room;
   a thermal controller which controls temperature of the room so as to heat the plurality of said semiconductor wafers up to a predetermined temperature;
   a signal generator which generates a test pattern signal for screening said semiconductor devices on the plurality of said semiconductor wafers which have been heated up to the predetermined temperature; and
   wafer holders which electrically interconnect said signal generator and each of said semiconductor devices, in order to provide said semiconductor devices respectively with the signals generated by said signal generator, and
   wherein said wafer holders each have a stage board to be in contact with a back surface of one of said semiconductor wafers, and a pressure board, arranged on a front surface of the one of said semiconductor wafers and having a plurality of electrode chips for electrically connecting said semiconductor devices and said signal generator.

2. The burn-in apparatus according to claim 1, wherein said slot array holds said semiconductor wafers each having a plurality of pathways which are formed across said inner and peripheral edge zones for supplying the test pattern signal to said semiconductor devices;
   each of said plurality of electrode chips has a larger width than a width of each of said pathways; and
   said pressure board presses said plurality of electrode chips against said pathways, thereby electrically connecting said plurality of electrode chips to said pathways, respectively.

3. The burn-in apparatus according to claim 2, wherein the plurality of said electrode chips are arranged so as to contact two points of said pathways sandwiching therebetween said inner zone, said pathways being formed among lines of matrix formed semiconductor devices on said semiconductor wafer.

4. The burn-in apparatus according to claim 3, wherein the plurality of said electrode chips are grouped by ends of said pathways being connected to, and said electrode chips in the same group are connected to each other by wires while one of said electrode chips in the group is connected to said signal generator.

* * * * *